(12) United States Patent
Chang et al.

(10) Patent No.: US 11,994,920 B2
(45) Date of Patent: May 28, 2024

(54) REDUCING HOLE BEZEL REGION IN DISPLAYS

(71) Applicant: Google LLC, Mountain View, CA (US)

(72) Inventors: Sun-il Chang, San Jose, CA (US); Sangmoo Choi, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/202,877

(22) Filed: May 26, 2023

(65) Prior Publication Data

US 2023/0341908 A1 Oct. 26, 2023

Related U.S. Application Data

(63) Continuation of application No. 17/598,738, filed as application No. PCT/US2021/018397 on Feb. 17, 2021, now Pat. No. 11,687,126.

(Continued)

(51) Int. Cl.
*G06F 1/16* (2006.01)
*H10K 59/00* (2023.01)

(52) U.S. Cl.
CPC .......... *G06F 1/1686* (2013.01); *G06F 1/1688* (2013.01); *H10K 59/00* (2023.02)

(58) Field of Classification Search
CPC ... G06F 1/1688; G06F 1/1686; H10K 59/131; H10K 59/1213; H10K 59/00
See application file for complete search history.

(56) References Cited

U.S. PATENT DOCUMENTS 8,144,084 B2 * 3/2012 Miller ................. G09G 3/3208
345/82
9,818,805 B2 11/2017 Choi et al.
(Continued)

FOREIGN PATENT DOCUMENTS

CN 108428704 8/2018
CN 108807426 11/2018
(Continued)

OTHER PUBLICATIONS

International Preliminary Report on Patentability in International Appln. No. PCT/US2021018397, dated Sep. 1, 2022, 9 pages.
(Continued)

*Primary Examiner* — Vinh T Lam
(74) *Attorney, Agent, or Firm* — Fish & Richardson P.C.

(57) ABSTRACT

A device includes: an array of light emitting elements extending in a first plane, each light emitting element being arranged to emit light; an array of pixel driver elements extending in a second plane beneath the array of pixels, in which each pixel driver element is configured to drive a corresponding light emitting element of the array of light emitting elements; a hole positioned within the array of light emitting elements and the array of pixel driver elements, in which the hole extends from the first plane through the second plane, a first multiple of light emitting elements from the array of light emitting elements in a first region adjacent the hole are arranged to provide a first resolution, and a second multiple of light emitting elements from the array of elements in a second region away from the hole are arranged to provide a second resolution.

16 Claims, 7 Drawing Sheets

Related U.S. Application Data

(60) Provisional application No. 62/977,946, filed on Feb. 8, 2020.

(56) References Cited

U.S. PATENT DOCUMENTS

| | | | |
|---|---|---|---|
| 9,940,888 B2 | 4/2018 | Ryoo et al. | |
| 10,134,825 B2 | 11/2018 | Shin et al. | |
| 10,224,508 B2 * | 3/2019 | Cai | H10K 59/1213 |
| 10,490,614 B2 | 11/2019 | Bae et al. | |
| 10,535,825 B2 | 1/2020 | Tanaka | |
| 10,607,573 B2 | 3/2020 | Silvanto et al. | |
| 10,665,158 B2 * | 5/2020 | Lee | G09G 3/3225 |
| 10,690,920 B2 | 6/2020 | Cok et al. | |
| 10,825,886 B2 | 11/2020 | Na et al. | |
| 10,847,599 B2 | 11/2020 | Jeon et al. | |
| 10,852,604 B2 * | 12/2020 | Luo | H10K 59/12 |
| 10,854,846 B2 * | 12/2020 | Kim | H10K 50/844 |
| 10,884,568 B2 | 1/2021 | Seo et al. | |
| 10,955,965 B2 | 3/2021 | Park et al. | |
| 10,969,832 B2 | 4/2021 | Lee et al. | |
| 11,093,059 B2 | 8/2021 | Han et al. | |
| 11,121,192 B2 * | 9/2021 | Han | G06F 3/0443 |
| 11,121,201 B2 | 9/2021 | Huang et al. | |
| 11,263,936 B2 | 3/2022 | Lee et al. | |
| 11,294,422 B1 * | 4/2022 | Srikanth | H04N 23/843 |
| 11,335,764 B2 * | 5/2022 | Her | H10K 59/353 |
| 11,393,889 B2 * | 7/2022 | Jin | H10K 59/90 |
| 11,527,738 B2 * | 12/2022 | Zhang | H10K 59/131 |
| 11,611,057 B2 * | 3/2023 | Park | H10K 59/1213 |
| 11,687,126 B2 * | 6/2023 | Chang | H10K 59/1213 345/156 |
| 2017/0110532 A1 | 4/2017 | Kim et al. | |
| 2017/0277313 A1 | 9/2017 | Lee et al. | |
| 2018/0017996 A1 | 7/2018 | Ryu et al. | |
| 2020/0034100 A1 | 1/2020 | Fan et al. | |
| 2020/0105828 A1 * | 4/2020 | Ryu | G06V 40/13 |
| 2020/0110501 A1 | 4/2020 | Lee et al. | |
| 2020/0144341 A1 | 5/2020 | Choi et al. | |
| 2020/0194730 A1 | 6/2020 | Park et al. | |
| 2021/0200274 A1 | 7/2021 | Lee et al. | |
| 2021/0202657 A1 | 7/2021 | Cho et al. | |
| 2021/0343823 A1 | 11/2021 | Tanaka et al. | |
| 2021/0399080 A1 * | 12/2021 | Lee | H10K 59/1213 |
| 2022/0107668 A1 * | 4/2022 | Cao | G02B 1/14 |
| 2022/0130929 A1 | 4/2022 | Saida et al. | |
| 2022/0190288 A1 | 6/2022 | Sonoda et al. | |
| 2022/0399422 A1 * | 12/2022 | Zhang | H10K 71/00 |
| 2023/0413642 A1 * | 12/2023 | Zeng | H10K 59/35 |

FOREIGN PATENT DOCUMENTS

| | | |
|---|---|---|
| CN | 108957881 | 12/2018 |
| CN | 109994082 | 7/2019 |
| CN | 110690261 | 1/2020 |
| CN | 111007951 | 4/2020 |
| CN | 111028765 A | 4/2020 |
| CN | 111123597 | 5/2020 |
| CN | 111129102 A | 5/2020 |
| CN | 106847085 | 6/2020 |
| CN | 112567322 | 3/2021 |
| CN | 107025875 | 8/2021 |
| CN | 110190087 | 8/2021 |
| CN | 109541867 | 1/2022 |
| CN | 110780501 | 4/2022 |
| CN | 111028765 B | 6/2022 |
| CN | 111129102 B | 7/2022 |
| CN | 110931541 | 10/2022 |
| EP | 3176772 | 6/2017 |
| EP | 3739628 | 11/2020 |
| EP | 3833049 | 6/2021 |
| JP | 6351677 | 7/2018 |
| JP | 2021-090141 | 6/2021 |
| WO | WO 2019199139 | 10/2019 |
| WO | WO 2020036275 | 2/2020 |
| WO | WO 2020066011 | 4/2020 |
| WO | WO 2020085592 | 4/2020 |

OTHER PUBLICATIONS

International Search Report and Written Opinion in International Appln. No. PCT/US2021/018397, dated Jun. 8, 2021, 15 pages.

\* cited by examiner

REDUCING HOLE BEZEL REGION IN DISPLAYS

CROSS-REFERENCE TO RELATED APPLICATIONS

This application is a continuation of U.S. patent application Ser. No. 17/598,738, filed on Sep. 27, 2021, which is a National Stage Application under 35 U.S.C. § 371 of International Application No. PCT/US2021/018397, filed Feb. 17, 2021, which claims the benefit of U.S. Provisional Application Ser. No. 62/977,946, filed Feb. 18, 2020. The disclosures of the prior applications are incorporated by reference in their entireties herein.

TECHNICAL FIELD

The present disclosure relates to reducing hole bezel regions in displays.

BACKGROUND

Smart devices, such as smartphones, include active areas, where a user may interact with the display of the device (e.g., through a touch screen). Smart devices may also include bezel areas that occupy space on the display and that are not used as part of the active areas. In some cases, smart devices also include openings or holes under the display for accepting components, such as cameras.

SUMMARY

In the case of smart devices that includes holes beneath the display panel for components such as cameras, there remains a boundary region, sometimes referred to as a bezel region, between the active area of the display and the hole, in which this boundary region is used for routing control lines, such as light emitting element control lines and pixel driver control lines, around the hole. Because of the number of control lines that need to be routed around the hole, this boundary region can be relatively large, and may occupy, in some cases, distances of several millimeters from the edge of the hole or from the edge of an encapsulant overflow region encircling the hole.

In general, in some aspects, the subject matter of the present application is embodied in a display device that reduces and/or eliminates the boundary region near the hole, and therefore increases the active area of the display device, by interspersing the control lines, which are routed around the hole, among the light emitting elements in a first region near or adjacent to the hole. In certain implementations, interspersing the control lines among the light emitting elements in the first region includes modifying the arrangement of the light emitting elements in the first region so that the first region exhibits a first display resolution. Further away from the hole in a second region, the light emitting elements are arranged to exhibit a second different display resolution. Since the second region does not have to accommodate routing control lines around holes, the display resolution of the second region can be greater than the display resolution of the first region.

The first region may be arranged such that light emitting elements in the first region are positioned within a first plane and directly over control lines extending along a second plane parallel to the first plane, without the light emitting elements being positioned directly over a corresponding pixel driver element. In contrast, light emitting elements in the second region are positioned directly or at least partially over a corresponding pixel driver element.

In general, in other aspects, the subject matter of the present disclosure may be embodied in devices that include a display panel, in which the display panel includes: an array of light emitting elements extending in a first plane beneath the display panel, the light emitting elements being arranged to emit light to a front side of the display panel; an array of pixel driver elements extending in a second plane beneath the array of pixels, in which the second plane may be parallel to the first, and the pixel driver elements are configured to drive the light emitting elements, respectively, of the array of light emitting elements; a hole positioned within the array of light emitting elements and the array of pixel driver elements, in which the hole extends from the first plane through the second plane, a first multiple of light emitting elements from the array of light emitting elements in a first region adjacent the hole are arranged to provide a first display resolution, and a second multiple of light emitting elements from the array of elements in a second region away from the hole are arranged to provide a second display resolution, the second display resolution being greater than the first display resolution.

Implementations of the devices may have one or more of the following features. For example, in some implementations, each one of the pixel driver elements may be configured to drive a corresponding one of the light emitting elements. Light emitting elements in the first region may be positioned directly over control lines extending along the second plane without being positioned directly over a corresponding pixel driver element. The control lines may include light emitting element control lines and pixel driver element control lines. Light emitting elements in the second region may be positioned at least partially over a corresponding pixel driver element. Light emitting elements in the second region may be positioned directly over a corresponding pixel driver element. The first region may extend around the hole, e.g., the first region may encircle the hole. The display panel may include an encapsulant overflow region extending from the first plane to the second plane and positioned between the hole and the first region, in which the encapsulant overflow region is devoid of light emitting elements, pixel driver elements, and control lines, and in which the encapsulant overflow region extends outwardly from the hole along the first and second planes for at least 0.5 mm. The first region may include multiple control line via regions distributed adjacent to light emitting elements, in which in the control line via regions, control lines transition from the first plane to the second plane. The control line via regions may be defined by an area that is approximately the same as an area occupied by a single light emitting element or by a single pixel driver element. The first display resolution may be less than or equal to 300 pixels per inch. The second display resolution may be greater than 300 pixels per inch. The second display resolution may be greater than 600 pixels per inch.

In some implementations, the hole includes a camera, a microphone and/or a speaker. The hole may include a device configured to detect electromagnetic radiation, such as an ambient light sensor or a proximity sensor. The hole may include a device configured to emit electromagnetic radiation, such as an infrared emitter. The hole may include more than one of the devices described above.

In some implementations, the encapsulant region and the hole define a circular area, and a diameter of the circular area is less than 4 mm. The diameter of the circular area may be less than 3 mm.

In general, in other aspects, the subject matter of the present disclosure may be embodied in a device that includes a display panel, in which the display panel includes: a first display region comprising a first multiple of light emitting elements and a multiple of pixel driver elements, in which the first multiple of light emitting elements are arranged to provide a first display resolution within the first display region; a hole positioned within the display; a detour routing boundary display region including a second multiple of light emitting elements and a multiple of detour routing control lines, in which the multiple of detour routing control lines extend around the hole, the second multiple of light emitting elements are arranged to provide a second display resolution within the detour routing boundary display region, and a first light emitting element within the first multiple of light emitting elements and at least one light emitting element within the second multiple of light emitting elements are configured to be controlled by a common pixel driver element within the first display region.

In general, different aspects of the subject matter disclosed herein may be combined in a single device. For instance, a device can include one or more light-emitting element-pixel driver sets in which a single pixel driver element is provided to drive multiple light emitting elements, one of which is located above the pixel driver element (e.g., outside of a detour routing boundary region) and one or more of which are located in a detour routing boundary region, e.g., near or adjacent to a hole and overlapping detour routing. The device further can include one or more light-emitting element pixel driver sets in which a pixel driver element (e.g., outside a detour routing boundary region) is provided to drive a single corresponding light-emitting element in the detour routing boundary region that overlaps detour routing.

Implementations of the device may include one or more of the following features. For example, in some implementations, the first display resolution is equal to the second display resolution. In some implementations, the first light emitting element within the first multiple of light emitting elements and the at least one light emitting element within the second multiple of light emitting elements are directly electrically coupled to a common electrode trace layer. In some implementations, the detour routing boundary display region is devoid of pixel driver control elements.

The detour routing boundary display region may extend at least partially around the hole, e.g., the detour routing boundary display region may encircle the hole. The first plurality of light emitting elements and second plurality of light emitting elements may extend in a first plane beneath the display panel. The plurality of pixel driver elements may extend in a second plane beneath the light emitting elements.

The display panel may include an encapsulant overflow region extending from the first plane to the second plane and positioned between the hole and the first region, in which the encapsulant overflow region is devoid of light emitting elements, pixel driver elements, and control lines, and in which the encapsulant overflow region extends outwardly from the hole along the first and second planes for at least 0.5 mm. The first display region may include multiple control line via regions distributed adjacent to light emitting elements, in which in the control line via regions, control lines transition from the first plane to the second plane. The control line via regions may be defined by an area that is approximately the same as an area occupied by a single light emitting element or by a single pixel driver element.

In some implementations, the hole includes a camera, a microphone and/or a speaker. The hole may include a device configured to detect electromagnetic radiation, such as an ambient light sensor or a proximity sensor. The hole may include a device configured to emit electromagnetic radiation, such as an infrared emitter. The hole may include more than one of the devices described above.

In some implementations, the encapsulant region and the hole define a circular area, and a diameter of the circular area is less than 4 mm. The diameter of the circular area may be less than 3 mm.

In some implementations, a plurality of light emitting elements within the second multiple of light emitting elements are configured to be controlled by a common pixel driver element within the first display region.

Various implementations of the subject matter disclosed herein may include one or more of the following advantages. For example, in some implementations, the lower display resolution region or regions still have enough display resolution that they do not adversely affect the readability and perceived quality of the display. In some implementations, providing the lower display resolution region with the interspersed control lines allows a reduction in the bezel region, allowing for increased use of display area. In some implementations, by providing light emitting elements in the detour routing boundary region which are controlled by a pixel driver element within the first display region it is not necessary to remove light emitting elements in an area outside of the detour routing boundary region to accommodate control lines. This allows control lines to be accommodated without reducing the display resolution, thereby allowing a reduction in the bezel region, allowing for increased use of display area.

The details of one or more embodiments are set forth in the accompanying drawings and the description below. Other features and advantages will be apparent from the description, and drawings, and claims.

DETAILED DESCRIPTION

In general, in some aspects, the subject matter of the present application is embodied in a display device that reduces and/or eliminates the boundary or bezel region near the hole, and therefore increases the active area of the display device, by interspersing the control lines that are routed around the hole among the light emitting elements in a first region near or adjacent to the hole. In certain implementations, interspersing the control lines among the light emitting elements in the first region includes modifying the arrangement of the light emitting elements in the first region so that the first region exhibits a first display resolution. Further away from the hole in a second region, the light emitting elements are arranged to exhibit a second different display resolution. Since the second region does not have to accommodate routing control lines around holes, the display resolution of the second region can be greater than the display resolution of the first region.

The first region may be arranged such that light emitting elements in a first plane are positioned directly over control lines extending along a second plane that is located beneath (and, e.g., parallel to) the first plane, without being positioned directly over a corresponding pixel driver element. In contrast, light emitting elements in the second region may be positioned directly over a corresponding pixel driver element.

Figure 1A:
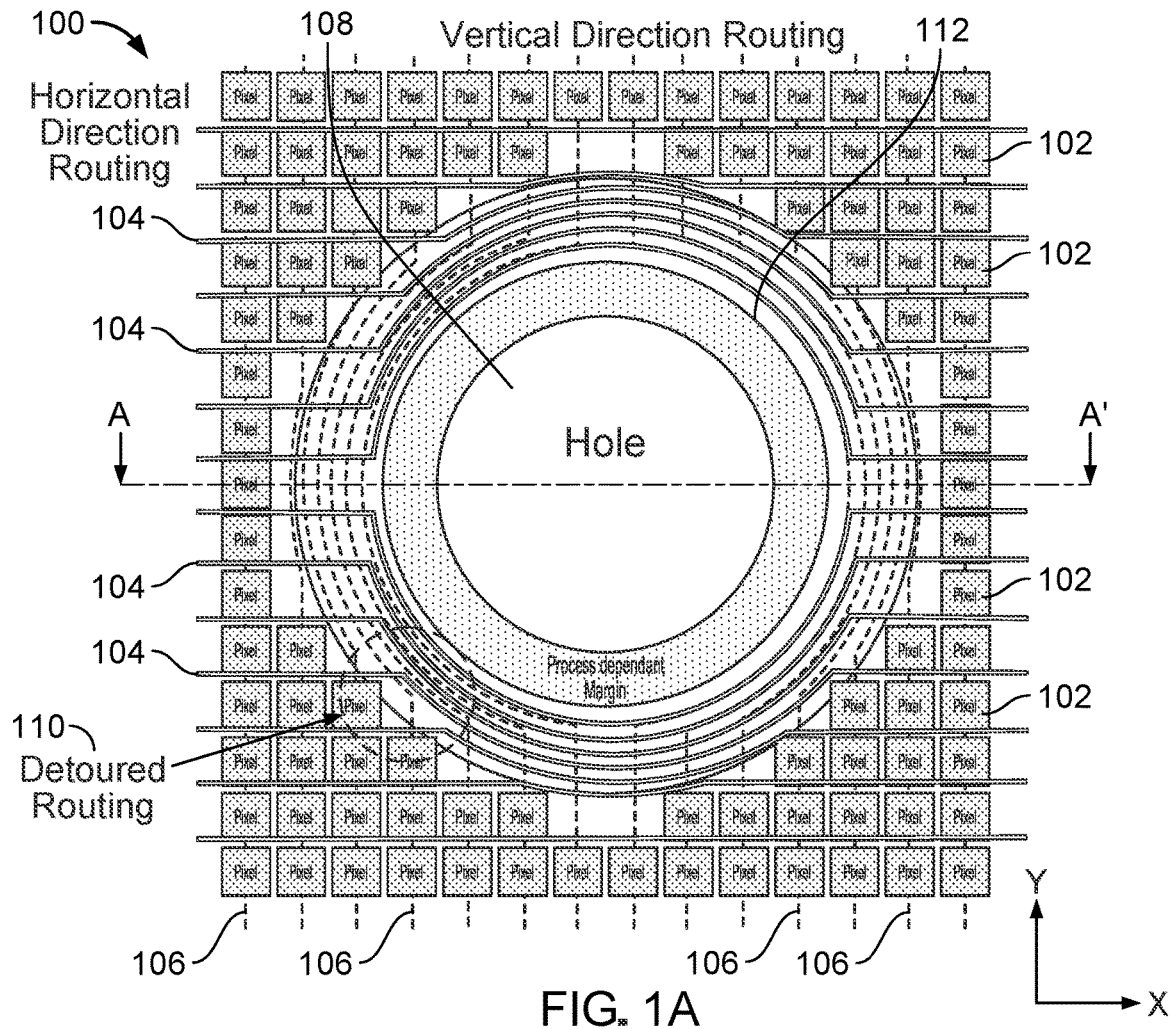
FIG. 1A is a schematic that illustrates a top view of an exemplary display device.

FIG. 1A is a schematic that illustrates a top view of an exemplary display device 100. The display device 100 includes multiple pixels 102, each of which includes a light emitting element, such as an organic light emitting diode. The pixels 102 are arranged in an array (e.g., a two-dimensional array along the X and Y-directions) having a particular display resolution. The light emitting elements of the pixels 102 may be controlled by corresponding pixel driver elements, such as thin film transistors. The display 100 also includes control lines 104, 106 for controlling the light emitting elements and the pixel driver elements of the pixels 102. The control lines can include an array of control lines 104 that extend horizontally across the array of pixels 102 (e.g., along the X-direction as shown in FIG. 1A), as well as an array of control lines 106 that extend vertically across the array of pixels 102 (e.g., along the Y-direction as shown in FIG. 1A). The area in which the pixels 102 are arranged may be understood to be the "active" area of the display.

In some implementations, the display device 100 includes a hole 108 around which the pixels 102 are arranged. The hole 108 can be used for receiving a component of the smart device, such as a camera, microphone or speaker. One or more other components may be included in the hole instead. For example, in some implementations, the hole 108 may be used to receive a device configured to detect electromagnetic radiation, such as an ambient light sensor (e.g., a silicon photodiode) or a proximity sensor. Alternatively, or in addition, the hole 108 may be used to receive a device configured to emit electromagnetic radiation such an infrared emitter. There is a boundary region 110, also referred to as a bezel or a "detour routing boundary region," between the active area of the display in which the pixels 102 are positioned and the hole 108. The boundary region 110 is used for routing the control lines 104, 106 around the hole 108. The boundary region 110 does not include pixel driver elements. The control lines 104, 106 within boundary region 110 may also be referred to as detour routing lines. Because of the number of control lines that need to be routed around the hole, this boundary region 110 can be relatively large, and may occupy, in some cases, a distance of several millimeters between the active area and the edge of the hole 108. The boundary region 110 may extend around the hole 108, e.g., the boundary region 110 may encircle the hole 108.

Figure 1B:
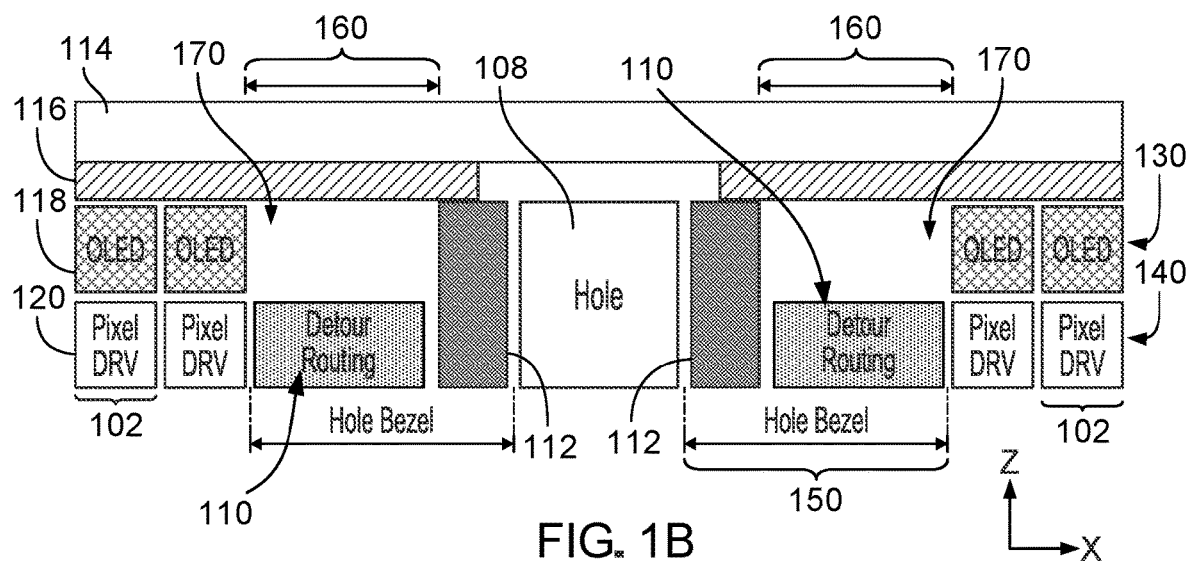
FIG. 1B is a schematic that illustrates a cross-section of through A-A of the device of FIG. 1A.

FIG. 1B is a schematic that illustrates a cross-section of through A-A of the device 100 of FIG. 1A. The sizes of the features shown in FIGS. 1A and 1B are not to scale. As shown in FIG. 1B, the display device 100 includes a front panel 114 formed of a material transparent to light emitted by the light emitting elements. For instance, the front panel 114 may include a transparent polymer such as trifluoroethylene. The front panel 114 is secured to a back panel region that includes the pixels 102.

In the present example, each pixel 102 includes a light emitting element 118 and a pixel driver element 120 (the light emitting element 118 and pixel driver element 120 may otherwise be referred to as a light emitting element-pixel driver element set). The light emitting elements 118 may include light emitting diodes such as organic light emitting diodes (OLEDs), though other light emitting elements may be used instead. The light emitting elements 118 may be formulated to emit light within an appropriate wavelength band (e.g., red, green, or blue light, or cyan, magenta, or yellow light). As disclosed herein, pixel driver elements may include circuitry required to drive light emitting elements. Such circuitry may include suitable hardware such as switches (e.g., thin film transistors), logic circuitry, capacitors, current driving circuitry, and the like that control the delivery of electrical current to a light emitting element. A lower substrate (not shown) provides mechanical support and protection for the light emitting elements 118 and the pixel driver elements 120 and can include, e.g., a transparent polymer such as poly-ethyl terephthalate, and can support one or more additional layers, such as a polyimide layer.

The light emitting elements 118 and pixel driver elements 120 of the pixels 102 are arranged across two planes that are parallel with the front panel 114 and, e.g., parallel with one another. For example, the light emitting elements 118 are provided in an array that extends in a first plane 130 beneath the front panel 114, in which each light emitting element 118 is arranged to emit light toward a front surface of the panel 114 (upper surface of panel 114 in FIG. 1B along the positive Z-direction). Additionally, the pixel driver elements 120 are provided in an array that extends in a second plane 140 beneath the first plane 130 (i.e. further from the front surface of the panel 114 than the first plane 130). As shown in FIG. 1B, the pixel driver elements 120 are positioned beneath (e.g., at least partially overlapped by or directly overlapped by) respective light emitting elements 118 in the first plane 130 to form multiple corresponding pixel elements 102. Each pixel driver element 120 may be configured to drive the light emitting element 118 that directly or at least partially overlaps the pixel driver element 120. The light emitting element 118 that directly or at least partially overlaps a pixel driver element 120 may be referred to as a corresponding light emitting element 118. In some implementations, regions 170 within the first plane 130 include one or more insulator layers, transparent cathode layer, and encapsulant, but do not include light emitting elements, pixel driver elements, or other control lines.

As explained with respect to FIG. 1A, the display device 100 may also include a boundary region 110 for providing space in which control lines 104, 106 may be routed around the hole 108. As shown in FIG. 1B, the boundary region 110 may be defined by width 160. In some implementations, the boundary region 110 can extend across both the first plane 130 and second plane 140.

As also shown in FIG. 1B, an upper surface of the light emitting elements 118 may be encapsulated by an encapsulant material 116. Encapsulant material 116 may include, e.g., a high-purity, low-volatile-outgas encapsulant, such as a silicone based material, that is optically clear to help reduce degradation of the light emitting elements 118. In some implementations, during fabrication of the device 100, the encapsulant 116 may overflow beyond the light emitting elements 118 and control lines 104, 106 that the encapsulant 116 is intended to cover. Accordingly, the display device 100 also may include, in some cases, an encapsulant overflow region (also referred to as process dependent margin) 112 extending through both the first plane 130 and the second plane 140 and positioned between the hole 108 and the active area that includes the pixels 102. The encapsulant overflow region 112 is devoid of light emitting elements, pixel driver elements, and control lines. The encapsulant overflow region 112 may extend outwardly from the hole 108 along the first plane 130 and along the second plane 140. The boundary region 110 and the encapsulant overflow region 112 together may, in some cases, be understood as a bezel region 150 of the device. In some implementations, a width of the bezel region 150 (extending outwardly within plane 130 away from an edge of the hole 108 in FIG. 1B) is at least several millimeters. The boundary region 110 extends outwardly away from the encapsulant overflow region 112 and has a width 160 (extending outwardly within plane 130 away from an edge of the hole 108 in FIG. 1B) between about 0.1 and about 3 mm, and therefore takes up space that could otherwise be used as an active area of the display. The region 170 located above the boundary region 110 and beneath the encapsulant 116 and front panel 114 may include one or more insulator layers. In certain implementations, the region 170 is void of control lines, light emitting elements or pixel driver elements.

Figure 1C:
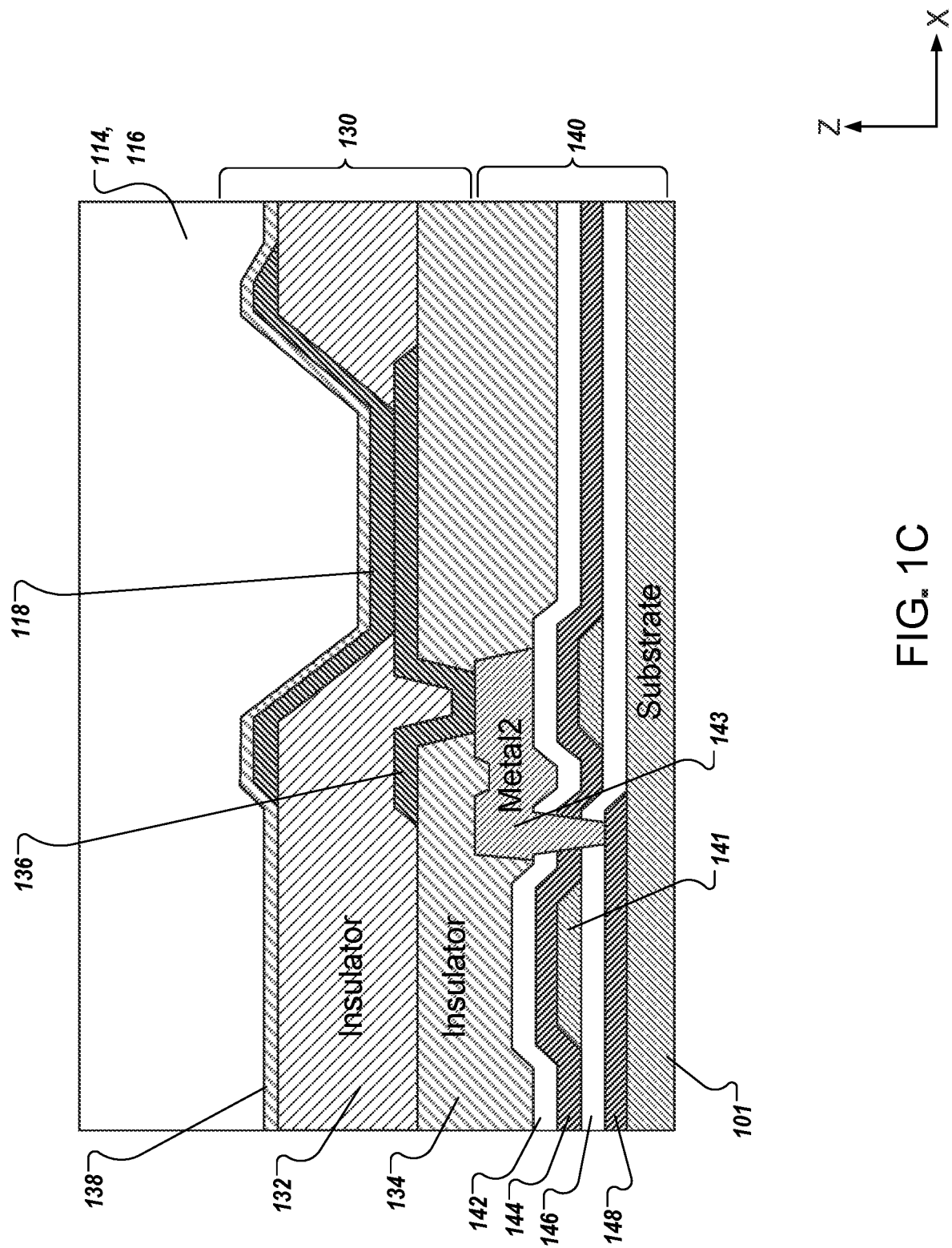
FIG. 1C is a schematic that illustrates a detailed configuration of an exemplary pixel region.
Figure 1D:
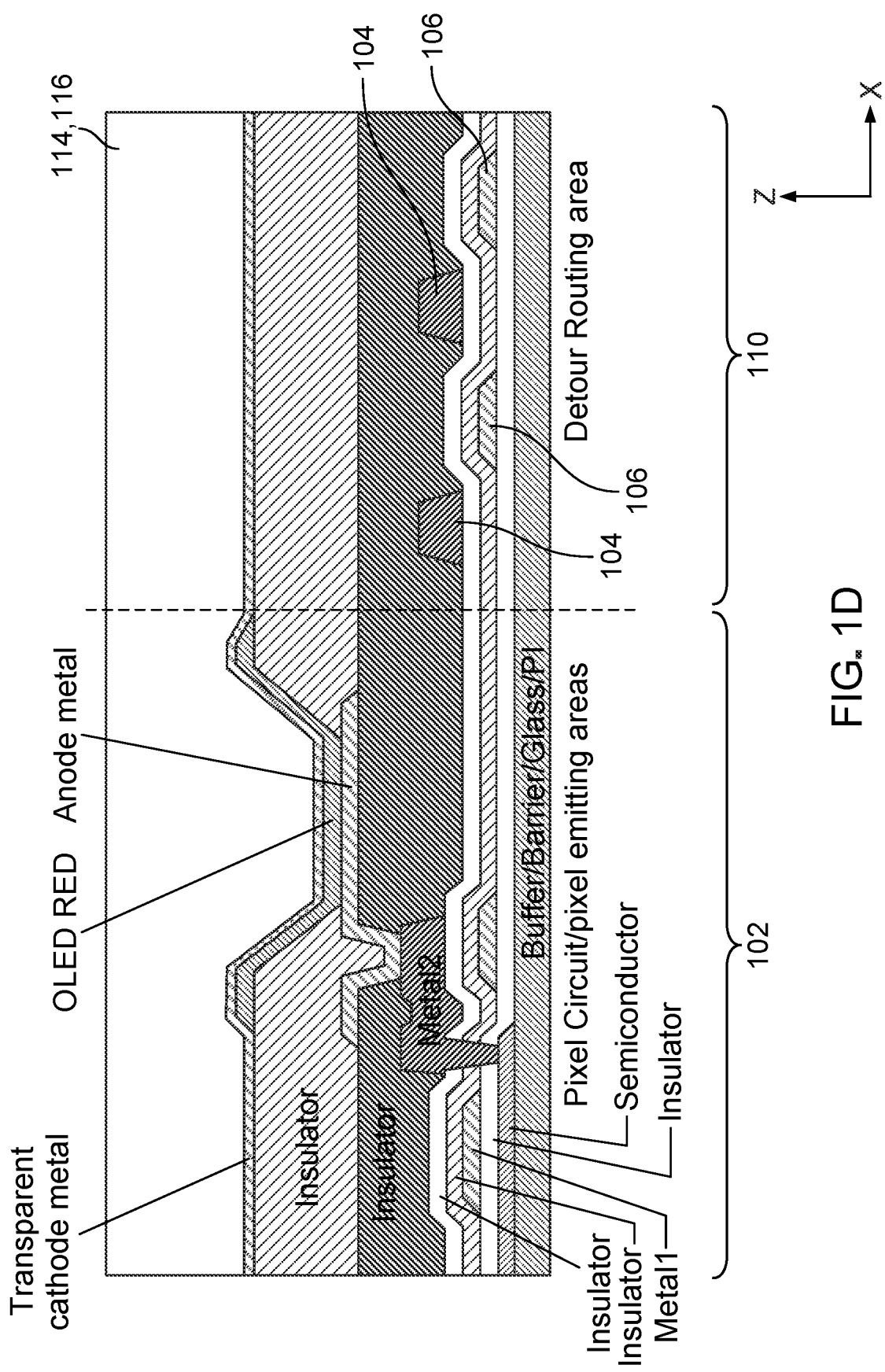
FIG. 1D is a schematic that illustrates a detailed configuration of an exemplary pixel region and an exemplary boundary region.

FIGS. 1C and 1D are schematics that illustrate cross-sections of more detailed configurations of an exemplary display device. In particular, FIG. 1C is a schematic that illustrates a detailed configuration of an exemplary pixel region, such as pixel region 102 in FIG. 1B, whereas FIG. 1D is a schematic that illustrates a detailed configuration of an exemplary pixel region 102 and an exemplary boundary region 110, such as boundary region 110 in FIG. 1B. The configurations shown in FIGS. 1C-1D are examples of light emitting element display structures and do not limit the design, number, or type of layers of the pixel regions or the boundary regions within a device.

As shown in FIG. 1C, the pixel region may be divided generally into two planes: a first plane 130 and a second plane 140. The first plane 130 may be a volumetric portion of the device located above and generally parallel to the second plane 140. The first plane 130 may include, e.g., a light emitting element 118, such as an OLED or other LED, one or more insulating layers 132, 134, and one or more contacts 136, 138 for the light emitting element 118. Insulating layers disclosed herein may be formed of an inorganic insulating layer. For instance, an insulating layer may be formed of a single layer or multiple layers formed of one of $SiO_2$, $SiNx$, $Al_2O_3$, $TiO_2$, $Ta_2O_5$, $ZrO_2$, or lead zirconate titanate (PZT). The second plane 140 may be a volumetric portion of the device that includes, e.g., a pixel driver element for the light emitting element 118, as well as one or more insulating layers. Both the first plane 130 and the second plane 140 are situated beneath the enapsulant layer 116 and the front panel 114. The light emitting element 118 is positioned at least partially over the pixel driver element within the second plane 140 without extending over the control lines 104, 106 of the boundary region 110. The contacts for the light emitting element 118 include a cathode 138 and an anode 136. The cathode 138 and anode 136 may be highly electrically conductive materials including, e.g., metals. The metals of the contacts may be metals that are transparent to visible light such as, e.g., indium tin oxide.

As an example, the pixel driver element may include multiple layers of material, including one or more insulating layers, one or more metal layers and one or more semiconductor layers. For instance, in the example in FIG. 1C, the pixel driver element within plane 140 includes a semiconductor layer 148, such as an amorphous silicon layer, that forms part of a thin-film transistor. The semiconductor layer 148 may be formed on a substrate 101. The pixel driver element further includes a first insulating layer 146 covering the semiconductor layer 148, as well as a metal layer 141 covering the first insulating layer 146. The first insulating layer 146 may be, e.g., a gate oxide, whereas the metal layer 141 may be a gate for adjusting the current through the thin film transistor. The pixel driver element may further include a second metal layer 143 in direct contact with the semiconductor layer 148 and extending through multiple insulating layers. The second metal layer 143 may be coupled to the drain or gate of the thin film transistor, while also in direct electrical contact with an electrode of the light emitting element 118, such as the anode 136. The pixel driver element may include additional insulating layers, such as layers 142, 144. Though the pixel driver element/control element is described in the example of FIGS. 1C-1D as having particular insulating layers, metal layers and semiconductor layers, more or fewer layers may form the pixel driver element. Furthermore, the reference to planes herein, such as first plane 130 and second plane 140 provides a general characterization of the arrangement of the light emitting elements with respect to the pixel driver elements within the display. The particular number of layers within each plane is not restricted to the examples disclosed herein. Further, in some cases, layers formed within one plane may extend across into another plane. For instance, insulating layer 134 may be understood to extend into both the first plane 130 and the second plane 140. However, the light emitting element 118 is generally understood to be positioned above (e.g., further away from the substrate along the Z-direction in FIG. 1D) the pixel driver element. For instance, the light emitting element 118 may overlap (e.g., partially overlap) the pixel driver element/control element.

To reduce and/or eliminate the unoccupied space of the boundary region near the hole, and therefore increase the active area of the display device, at least some of the light emitting elements of the display device may be re-positioned closer to the hole. In a particular example, some of the light emitting elements may be positioned directly over the re-routed control lines and/or over the re-routed control lines within the boundary region. In this way, the re-routed control lines within the boundary region appear, from a top view, to be interspersed among the light emitting elements in a first region near or adjacent to the hole. In certain implementations, interspersing the control lines among the light emitting elements includes modifying the arrangement of the light emitting elements in the first region so that the first region exhibits a first display resolution. Further away from the hole in a second region, the light emitting elements are arranged to exhibit a second different display resolution. Since the second region does not have to accommodate routing control lines around holes, the display resolution of the second region can be greater than the display resolution of the first region.

Figure 2A:
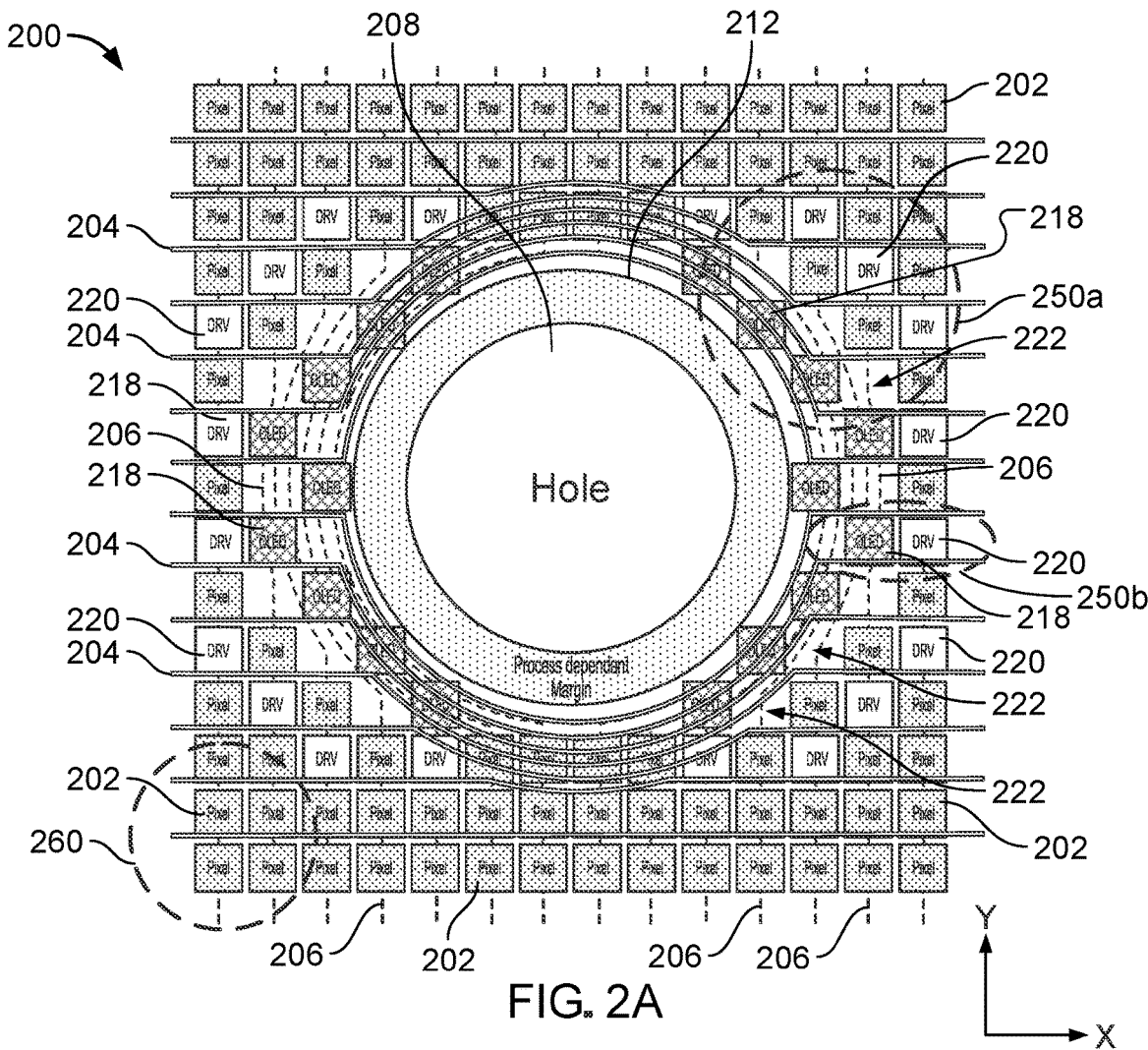
FIG. 2A is a schematic illustrating a top view of an exemplary display device.

FIG. 2A is a schematic illustrating a top view of an exemplary display device 200 that incorporates the modification. Similar to the display device 100, display device 200 includes pixels 202 arranged in an array, control lines 204 extending horizontally (e.g., along the X-direction) across the array, control lines 206 extending vertically (e.g., along the Y-direction) across the array, a hole 208, and an encapsulant overflow region 212. The control lines 204, 206 may also be referred to as detour routing lines 204, 206. In place of the boundary region 110 from FIG. 1, one or more first regions 250 (e.g., regions 250a, 250b), next to the hole 208 and the encapsulant region (also referred to as process dependent margin) 212, are provided, in which multiple light emitting elements 218 in the first regions 250 are arranged to provide a first display resolution. Away from the hole 208 and encapsulant region 212, a second region 260 is provided, in which the light emitting elements 218 are arranged to provide a second display resolution, with the second display resolution being greater than the first display resolution of the first region 250.

Figure 2B:
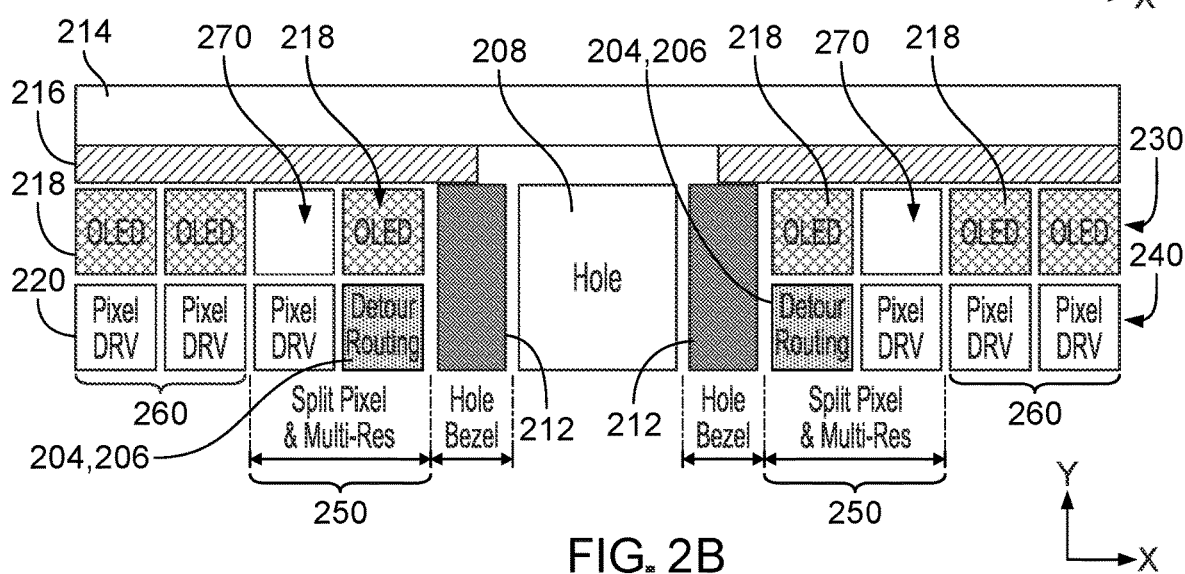
FIG. 2B is a schematic illustrating an exemplary cross-section of a display device, such as the display device of FIG. 2A.

The reason the display resolution of the first region 250 is lower than the display resolution of the second region 260 is because the light emitting elements 218 in the first region 250 are laterally spaced apart (e.g., along the Y and X-directions) and away from the corresponding pixel driver elements 220 so as to occupy space within the former boundary region (e.g., boundary region 110 in FIG. 1A). For instance, as shown in FIG. 2B, which is a schematic illustrating an exemplary cross-section of device 200, the light emitting elements 218 again are arranged in an array that extends along a first plane 230 and the pixel driver elements 220 again are arranged in an array that extends along a second plane 240. However, in the first region 250, each light emitting element 218 is positioned directly over the detour routing control lines 204, 206 extending along the second plane 240, rather than directly over the corresponding pixel driver element 220 that powers the light emitting element 218. The region 270 over the pixel driver element 220, in contrast, may include one or more insulator layers and transparent electrode layer but does not include light emitting elements, pixel driver elements, or other control lines. In this way, the detour routing control lines 204, 206 may occupy generally the same region as the display device 100, but now the boundary region may be used as part of the active area of the display, thus reducing the amount of dead or unused space within the boundary region by creating a region of lower display resolution.

It is still the case that, in the first region 250, a light emitting element 218 is driven by a corresponding pixel driver element 220 (in which the light emitting element 218 and pixel driver element 220 are otherwise referred to as a light emitting element-pixel driver element pair). Thus, for the first region 250, each light emitting element 218 and its corresponding pixel driver element 220 may be understood as a separate pixel element. The display resolution of the first region 250 may be less than or equal to 300 pixels per inch such as, e.g., 250 pixels per inch, 200 pixels per inch, 150 pixels per inch, or 100 pixels per inch, among others.

Additionally, as in the display device 100, the encapsulant overflow region 212 is devoid of light emitting elements, pixel driver elements, and control lines, and extends outwardly from the hole 208 along the first and second planes 230, 240.

As shown in FIG. 2A, the first region 250 extends entirely around the hole 208. However, in some implementations, the first region 250 extends only partially around the hole 208. In some implementations, there are multiple first regions 250 having the interspersed light emitting elements with a first display resolution that is less than a display resolution of the second region 260 as described herein. The multiple first regions 250 may be non-contiguous, e.g., they may be spaced apart from one another around the hole 208.

The second region 260 outside of the first region 250 includes multiple light emitting elements 218 that are arranged to provide a second display resolution, in which the second display resolution being greater than the first display resolution. This is because the second region 260 that is further away from the hole 208 does not have to accommodate re-routing/detour control lines. In the second region 260, each light emitting element 218 in the first plane 230 is positioned directly over a corresponding pixel driver element 220 in the second plane 240 to form a separate pixel element 202. The display resolution of the second region 260 may be greater than 300 pixels per inch including, e.g., 350 pixels per inch, 400 pixels per inch, 450 pixels per inch, 500 pixels per inch, 550 pixels per inch, 600 pixels per inch, 650 pixels per inch, 700 pixels per inch, or 750 pixels per inch, among others. Although FIG. 2B shows the detour routing 204, 206 positioned beneath the light emitting elements 218 in the first region 250, in some implementations, one or more of the detour routing 204, 206 can be positioned to traverse over the light emitting element 218, e.g., one or more of the detour routing 204, 206 can be positioned in the first plane 230 with the light emitting element 218, and/or a light emitting element 218 can be positioned in the second plane 240. To allow the detour routing 204, 206 to traverse from the first plane 230 to the second plane 240, the first region 250 may include multiple control line via regions distributed adjacent to light emitting elements 218, in which in the control line via regions, detour routing 204, 206 transition from the first plane 230 to the second plane 240. In some implementations, the control line via regions may be defined by an area that is approximately the same or less than an area occupied by a single light emitting element 218 or by a single pixel driver element 220.

By forming the display device to include multiple different display resolution areas in which the control lines can be routed through the lower resolution area, it is possible to increase the size of the active area of the display and reduce the amount of dead space that is not used for the active area. For instance, the region unusable for the active area in FIG. 1A may be approximated as a circle having a diameter of greater than 4 mm including, e.g., a diameter of 5 mm, 6 mm or 7 mm, among others. However, the region unusable for the active area in FIG. 2A (which includes the encapsulant overflow region 212 and the hole 208) may be approximated as a circle having a diameter that is equal to or less than 4 mm, such as equal to or less than 3 mm.

Figure 2C:
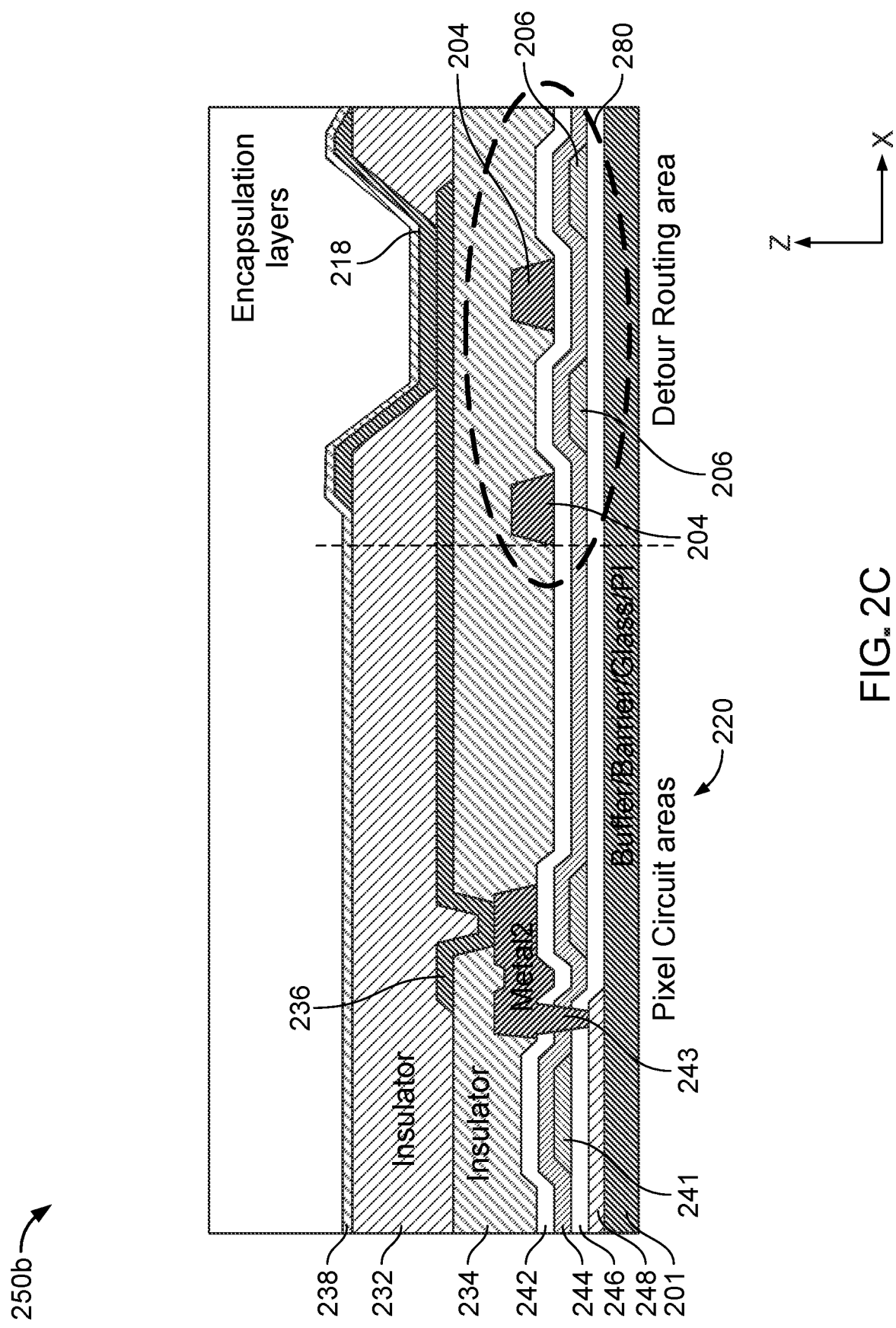
FIG. 2C is a schematic that illustrates a cross-section of a detailed configuration of an exemplary display device.

FIG. 2C is a schematic that illustrates a cross-section of a more detailed configuration of an exemplary display device according to the present disclosure. In particular, FIG. 2C is a schematic that illustrates a detailed configuration of a relatively low display resolution region, such as region 250b in FIG. 2A, in which the light emitting element 218 within the region 250b is laterally displaced so as to be positioned directly over detour routing control lines 204, 206 instead of over the pixel driver element, such as shown in FIGS. 1A-1D. The configuration shown in FIG. 2C is an example of a light emitting element display structure and does not limit the design, number, or type of layers within a display device.

As shown in FIG. 2C, the display device may include one or more insulating layers 232, 234, and one or more contacts 236, 238 for the light emitting element 218. The contacts for the light emitting element 218 include a cathode 238 and an anode 236. The cathode 238 and anode 236 may be highly electrically conductive materials including, e.g., metals. The metals of the contacts may be metals that are transparent to visible light such as, e.g., indium tin oxide.

The pixel driver element 220 may include multiple layers of material, including one or more insulating layers, one or more metal layers and one or more semiconductor layers. For instance, the pixel driver element 220 includes a semiconductor layer 248, such as an amorphous silicon layer, that forms part of a thin-film transistor. The semiconductor layer 248 may be formed on a substrate 201. The pixel driver element 220 further includes a first insulating layer 246 covering the semiconductor layer 248, as well as a metal layer 241 covering the first insulating layer 246. The first insulating layer 246 may be, e.g., a gate oxide, whereas the metal layer 241 may be a gate for adjusting the current through the thin film transistor. The pixel driver element 220 may further include a second metal layer 243 in direct contact with the semiconductor layer 248 and extending through multiple insulating layers. The second metal layer 243 may be coupled to the drain or gate of the thin film transistor, while also in direct electrical contact with an electrode of the light emitting element 218, such as the anode 236. The anode 236 extends laterally away from the region 220 in which the pixel driver element is formed to a position located directly above the detour routing 204, 206 where the light emitting element 218 is provided. The pixel driver element may include additional insulating layers, such as layers 242, 244. Though the pixel driver element is shown in the example of FIG. 2C as having particular insulating layers, metal layers and semiconductor layers, more or fewer layers may form the pixel driver element. Further, other pixel driver element designs may be used instead. In regions 260, which are far from the hole, the configuration of the light emitting element-pixel driver element pairs instead may be constructed as shown in FIG. 1C, in which the light emitting element 118 is formed generally in the region of the pixel driver element and does not overlap the detour routing control lines.

Other arrangements of the display device that reduce or eliminate the dead space of the detour routing boundary region are also possible. For instance, in some implementations, the emissive area of a light emitting element-pixel driver element pair can be divided into multiple emissive elements, each of which is controlled by the same pixel driver element. A first one of the emissive elements remains positioned outside of the detour routing boundary region and over the pixel driver element that powers the first emissive element. One or more of the other emissive elements that are powered by the same pixel driver element may be positioned within the detour routing boundary region over detour routing lines. As a result, the dead space of the detour routing boundary region can be reduced while maintaining a relatively high display resolution both in the detour routing boundary region and outside of the detour routing boundary region.

Figure 3A:
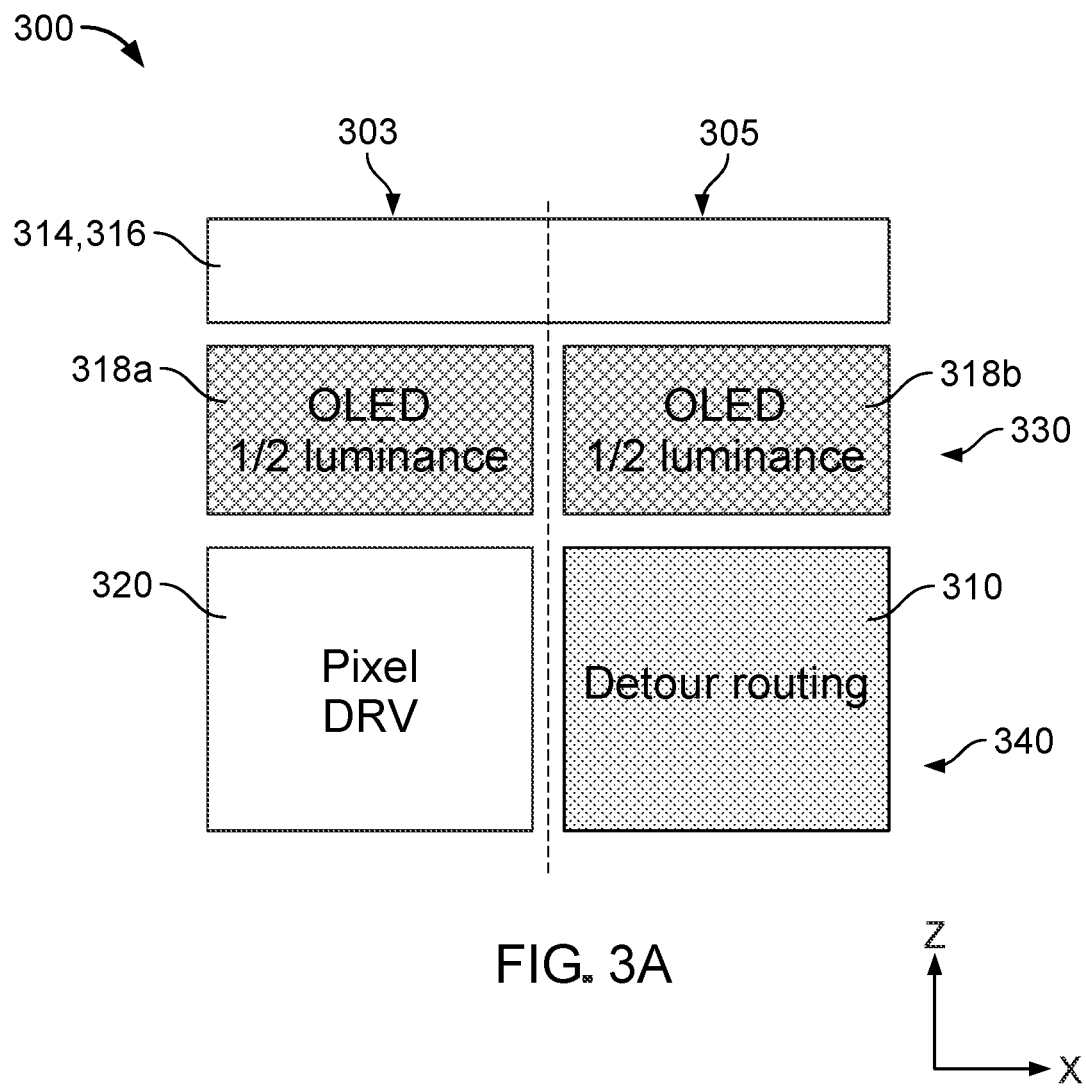
FIG. 3A is a schematic illustrating an exemplary cross-section of a portion of a display device corresponding to a single light emitting element-pixel driver set.
Figure 3B:
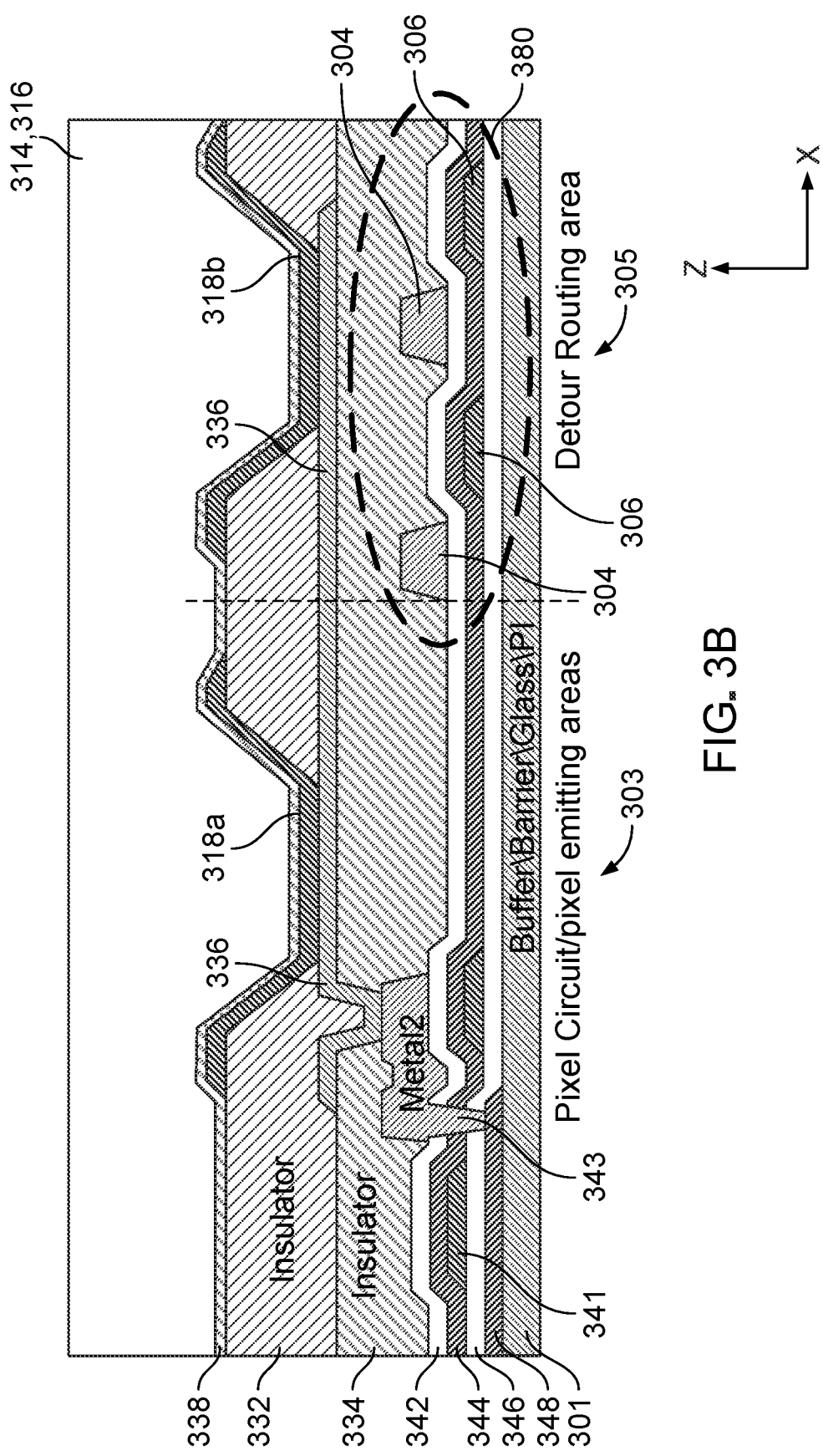
FIG. 3B is a schematic that illustrates a cross-section of a more detailed configuration of the exemplary light emitting element/pixel driver element set shown in FIG. 3A.

FIGS. 3A and 3B are schematics that illustrate examples of a configuration in which multiple emissive elements are provided in a light emitting element-pixel driver element set. FIG. 3A is a schematic illustrating an exemplary cross-section of a portion of a display device corresponding to a single light emitting element-pixel driver set 300. Similar to the display devices 100 and 200, the display device of the present implementation includes pixels arranged in an array, as well as control lines extending both horizontally (e.g., along the X-direction) and vertically (e.g., along the Y-direction) across the array. Additionally, the display device of the present implementation also includes a hole (not shown in FIG. 3A) around which is located a detour routing boundary region 305 where the control lines are diverted, again similar to display devices 100 and 200. As in other implementations, the detour routing boundary region 305 may entirely or partially surround the hole within the display. The display device may include encapsulant overflow region similar to that described above.

In contrast to the light-emitting element-pixel driver element sets of the display devices 100 and 200, however, the emissive area for set 300 is divided into at least two separate light emitting elements. In particular, in the example shown in FIG. 3A, the emissive area of set 300 includes a first light emitting element 318a and a second light emitting element 318b. The first light emitting element 318a is positioned generally over and in the same region (e.g., outside of the detour routing control region) 303 of the display as the pixel driver element 320. The second light emitting element 318b is positioned within the detour routing boundary region 305 and over detour routing lines 310. In other words, a first light emitting element within a first region 303 that includes the pixel driver elements and at least one light emitting element within the detour routing boundary region 305 that includes the detour routing control lines are configured to be powered by a common pixel driver element within the first region 303. As a result, unlike the display devices 100 and 200, there is no reduction in display resolution in the area 303 of the display outside of the detour routing boundary region 305 that would otherwise be caused by moving a light emitting element directly over detour routing control lines. Instead, the resolution can remain the same throughout the area 303 of the display that is outside of the detour routing boundary region 305, as well as in the detour routing boundary region 305. Although only one light emitting element/pixel driver set having the construction 300 is shown in FIG. 3A, a display may include multiple sets having the same construction may be employed in a display. The first light emitting element 318a and the second light emitting element 318b extend in a first plane 330 beneath the display panel. The pixel driver element 320 and the detour routing lines 310 extend in a second plane 340 beneath the light emitting elements 318a, 318b.

In some implementations, the total current (and thus power) delivered to the multiple generally same size light emitting elements (e.g., light emitting elements 318a and 318b) driver by a single pixel driver element is the same as would be delivered to a pixel's emissive area constituted by a single light-emitting element. Accordingly, in some cases, the light output of each of the multiple light emitting elements that are driven by a single pixel driver element is reduced relative to the light output by a single light emitting element driver by a single pixel driver element. For instance, in the example shown in FIG. 3A, each of the first light emitting element 318a and the second light emitting element 318b is driven by pixel driver element 320 and each emits a luminance that is equal to about ½ to the total luminance if only a single light emitting element were used instead.

Although FIG. 3A shows just two light emitting elements driven by a single pixel driver element, additional light emitting elements may be used as well. In such cases, the luminance of the each light emitting element is reduced proportional to the number of light emitting elements driven by a single pixel driver element. For instance, in some cases, the emissive area driven by a single pixel driver element is constituted by three, four, five, or 10 separate light emitting elements. In such cases, the luminance is reduced relative to the case of one light emitting element by ⅓, ¼, ⅕, or 1/10, respectively.

In other implementations, the decrease in luminance caused by increasing the number of light emitting elements driven by a single pixel driver element can be compensated by having the pixel driver element increase the drive current relative to pixels having a single light emitting element and single pixel drive element. Thus, for example, a single pixel drive element (e.g., pixel driver element 320) that drives two separate light emitting elements (e.g., light emitting element 318a and light emitting element 318b) can increase the current delivered to both of the separate light emitting elements so that the luminance exhibited by each of the light emitting elements equals the luminance exhibited by a pixel constituted by a single light emitting element and a single pixel driver element.

FIG. 3B is a schematic that illustrates a cross-section of a more detailed configuration of the exemplary light emitting element/pixel driver element set 300 shown in FIG. 3A. In particular, as shown in FIG. 3B, two light emitting elements (first light emitting element 318a and second light emitting element 318b) are provided and coupled to a single pixel driver element 320. Each of the light emitting elements may include, e.g., a light emitting diode, such as an organic light emitting diode. The first light emitting element 318a is positioned in an area 303 of the display device that is outside of the detour routing boundary region 305. The first light emitting element 318a may be positioned at least partially over a corresponding pixel driver element that is configured to control the first light emitting element 318a. In the example of FIG. 3B, the pixel driver element may be formed on a substrate 301 as a thin film transistor that includes insulating layers 342, 244, a gate metal 341, a gate insulator layer 346, a semiconductor layer 348, and an anode electrode 343. Though the pixel driver element is shown in the example of FIG. 3B as having particular insulating layers, metal layers and semiconductor layers, more or fewer layers may form the pixel driver element. Other pixel driver element designs may be used instead.

The second light emitting element 318b is positioned in the detour routing boundary region 305. The second light emitting element 318b may be positioned over a group 380 of one or more detour routing control lines 304, 306. The second light emitting element 318b and the first light emitting element 318a may both be electrically coupled to the same pixel driver element. For instance, an anode trace layer 336 may be formed on insulating layer 334 and provide a common electrical connection from the pixel driver element to both the first light emitting element 318a and the second light emitting element 318b. The anode trace layer 336 may be formed from an electrically conductive material, such as a metal layer, or a transparent electrically conductive material, such as ITO. Accordingly, the anode trace layer 336 provides a direct electrical connection from the pixel driver element to both elements 318a and 318b. Both of the first light emitting element 318a and the second light emitting element 318b also may be electrically coupled to a common cathode trace layer 338. The cathode layer 338 may be formed from an electrically conductive material, such as a metal layer, or a transparent electrically conductive material, such as ITO. Accordingly, the cathode trace layer 338 provides a direct electrical connection to both elements 318a and 318b. The display device may include one or more insulating layers, such as insulating layers 332 and 334 to support the light emitting elements, the anode trace layers, and/or the cathode trace layers. The anode trace layers and the cathode trace layers may each be referred to as the electrode trace layers, and may be configured to provide electrical connections to electrodes of the light emitting elements 318a, 318b. Though FIG. 3B depicts only a single light emitting element (light emitting element 318b) formed in the detour routing boundary region 305 and electrically connected to the pixel driver element, multiple light emitting elements that are driven by the same pixel driver element may be formed within the detour routing boundary region 305. For instance, in some implementations, 2, 3, 4, 5, or 10 light emitting elements, may be formed within the detour routing boundary region 305 and electrically coupled to a common pixel driver element that is located outside of the detour routing boundary region 305 in region 303. Because additional light emitting elements can be located in the detour routing boundary region without needing to remove the light emitting elements in an area outside of the detour routing boundary region, the display resolution of region 305 may be designed to be the same as the display resolution of region 303. Further, the display resolution of regions 303 and 305 may be designed to be the same as the display resolution of regions of the display (not shown) further away from any holes. Furthermore, similar to the display devices 100 and 200, the detour routing boundary region of the exemplary configuration covered by FIGS. 3A-3B, such as region 305, may include detour routing control lines but no pixel driver elements. In contrast, the area outside of the detour routing boundary region, such as region 303, may include light emitting elements, control lines, and pixel driver elements.

A number of embodiments have been described. Nevertheless, it will be understood that various modifications may be made without departing from the spirit and scope of the invention. Accordingly, other embodiments are within the scope of the following claims. For example, a device can include combinations of configurations covered by the disclosure relating to FIGS. 2A-2B and FIGS. 3A-3B. In particular, a device can include one or more light-emitting element-pixel driver sets in which a single pixel driver element is provided to drive multiple light emitting elements, one of which is located above the pixel driver element (e.g., outside of the detour routing boundary region) and, one or more of which are located in a detour routing boundary region, e.g., near or adjacent to a hole and overlapping detour routing, such as in FIGS. 3A-3B. The device further can include one or more light-emitting element pixel driver sets in which a pixel driver element (e.g., outside a detour routing boundary region) is provided to drive a single corresponding light-emitting element in the detour routing boundary region that overlaps detour routing, such as in FIGS. 2A-2B.

What is claimed is:

1. A device comprising a display panel, wherein the display panel comprises:
    an array of light emitting elements extending in a first plane beneath the display panel, the light emitting elements being arranged to emit light to a front side of the display panel;
    an array of pixel driver elements extending in a second plane beneath the array of pixels, wherein the pixel driver elements are configured to drive the light emitting elements, respectively, of the array of light emitting elements;
    a hole positioned within the array of light emitting elements and the array of pixel driver elements, wherein the hole extends from the first plane through the second plane,
    wherein a first plurality of light emitting elements from the array of light emitting elements in a first region adjacent the hole are arranged to provide a first display resolution, and a second plurality of light emitting elements from the array of elements in a second region away from the hole are arranged to provide a second display resolution, the second display resolution being greater than the first display resolution, wherein each light emitting element of the first plurality of light emitting elements in the first region is communicatively coupled to a respective pixel driver element that is configured to drive the light emitting element, and wherein the respective pixel driver is located in the second region.

2. The device of claim 1, wherein each light emitting element of the first plurality of light emitting elements in the first region is positioned directly over control lines extending along the second plane, and wherein the control lines comprise light emitting element control lines and pixel driver element control lines.

3. The device of claim 1, wherein each light emitting element of the second plurality of light emitting elements in the second region is positioned directly over a respective pixel driver element that is configured to drive the light emitting element.

4. The device of claim 1, wherein the first region extends around the hole.

5. The device of claim 1, wherein the display panel comprises an encapsulant overflow region extending from the first plane to the second plane and positioned between the hole and the first region, wherein the encapsulant overflow region is devoid of light emitting elements, pixel driver elements, and control lines, and wherein the encapsulant overflow region extends outwardly from the hole along the first and second planes for at least 0.5 mm.

6. The device of claim 1, wherein the first resolution is less than or equal to 300 pixels per inch.

7. The device of claim 1, wherein the second resolution is greater than 300 pixels per inch.

8. The device of claim 7, wherein the second resolution is greater than 600 pixels per inch.

9. The device of claim 1, wherein the hole comprises a camera.

10. The device of claim 1, wherein the hole comprises a microphone or a speaker.

11. The device of claim 1, wherein the hole comprises a device configured to detect electromagnetic radiation.

12. The device of claim 11, wherein the device configured to detect electromagnetic radiation comprises an ambient light sensor or a proximity sensor.

13. The device of claim 1, wherein the hole comprises a device configured to emit electromagnetic radiation.

14. The device of claim 13 wherein the device configured to emit electromagnetic radiation comprises an infrared emitter.

15. The device of claim 1, wherein the encapsulant region and the hole define a circular area, and a diameter of the circular area is less than 4 mm.

16. The device of claim 15, wherein the diameter of the circular area is less than 3 mm.

* * * * *